(12) United States Patent
Bhattacharya et al.

(10) Patent No.: US 7,276,957 B2
(45) Date of Patent: Oct. 2, 2007

(54) FLOATING WELL CIRCUIT HAVING ENHANCED LATCH-UP PERFORMANCE

(75) Inventors: Dipankar Bhattacharya, Macungie, PA (US); Makeshwar Kothandaraman, Whitehall, PA (US); John C. Kriz, Palmerton, PA (US); Duane J. Loeper, Spring City, PA (US); Bernard L. Morris, Emmaus, PA (US); Yehuda Smooha, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 48 days.

(21) Appl. No.: 11/239,840

(22) Filed: Sep. 30, 2005

(65) Prior Publication Data

US 2007/0075748 A1    Apr. 5, 2007

(51) Int. Cl.
*H03K 0/31*    (2006.01)
(52) U.S. Cl. ............... 327/534; 327/537; 327/530
(58) Field of Classification Search ........... 327/530, 327/538, 543, 545, 546, 534, 537
See application file for complete search history.

(56) References Cited

U.S. PATENT DOCUMENTS

| | | | | |
|---|---|---|---|---|
| 4,871,927 A * | 10/1989 | Dallavalle | ............... | 327/546 |
| 5,160,855 A * | 11/1992 | Dobberpuhl | ............... | 327/108 |
| 5,880,620 A * | 3/1999 | Gitlin et al. | ............... | 327/534 |
| 5,909,140 A * | 6/1999 | Choi | ............... | 327/534 |
| 5,963,083 A * | 10/1999 | Kothandaraman et al. | .. | 327/545 |
| 6,008,689 A * | 12/1999 | Au et al. | ............... | 327/534 |
| 6,111,450 A * | 8/2000 | Powell et al. | ............... | 327/333 |
| 6,184,700 B1 * | 2/2001 | Morris | ............... | 326/14 |
| 6,333,571 B1 * | 12/2001 | Teraoka et al. | ............... | 307/125 |
| 6,351,158 B1 * | 2/2002 | Shearon et al. | ............... | 327/108 |
| 6,707,333 B2 * | 3/2004 | Matsumoto et al. | ............... | 327/534 |
| 6,774,704 B2 * | 8/2004 | Kushnarenko | ............... | 327/530 |

* cited by examiner

*Primary Examiner*—Kenneth B. Wells
*Assistant Examiner*—Hai L. Nguyen

(57) ABSTRACT

A circuit for defining a voltage potential of a floating well in which is formed at least one metal-oxide-semiconductor device includes a sense circuit operative to detect a voltage at a node to which the floating well is connected and to generate a control signal indicative of whether the voltage at the node is substantially within a voltage range. A lower value of the voltage range is substantially equal to a threshold voltage below a first supply voltage of the circuit. An upper value of the voltage range is substantially equal to a threshold voltage above the first supply voltage. The circuit for defining the voltage potential of the floating well further includes a voltage generator circuit operative to receive the control signal and to generate a bias signal for setting a voltage potential of the well in response to the control signal, the bias signal being controlled throughout the voltage range.

20 Claims, 7 Drawing Sheets

FLOATING WELL CIRCUIT HAVING ENHANCED LATCH-UP PERFORMANCE

FIELD OF THE INVENTION

The present invention relates generally to electronic circuits, and more particularly relates to circuits for reducing latch-up.

BACKGROUND OF THE INVENTION

Buffer circuits (e.g., output buffers, input buffers, and bidirectional buffers) are employed in a variety of electronic devices and applications. Each of these buffer circuits typically includes an output driver stage including a p-type metal-oxide-semiconductor (PMOS) device, MPO, and an n-type metal-oxide-semiconductor (NMOS) device, MNO, connected to an external input/output (IO) pad at node N1, as shown in FIG. 1. Devices MPO and MNO are driven by control signals PG and NG, respectively, generated by control circuitry in the buffer circuit. Generally, MPO and MNO are large transistors which are capable of providing the currents that are associated with driving off-chip loads.

In some applications, a buffer circuit running at a particular supply voltage, such as VDDIO (e.g., 3.3 volts), may be subjected to a voltage potential, PAD, at the IO pad (node N1) which is substantially higher than what is supported by the semiconductor process technology used to fabricate the buffer circuit. Essentially all PMOS and NMOS devices have associated therewith parasitic diodes, DP and DN, respectively, between their source/drains and the underlying well or substrate. When the voltage PAD exceeds the supply voltage VDDIO by about a threshold voltage of the PMOS device MPO, the parasitic diode DP associated with MPO will undesirably become forward-biased, thereby conducting a large current. This large diode current can trigger latch-up or, at a minimum, cause significant parasitic currents to flow.

To avoid forward biasing the parasitic diode DP associated with the output stage of the buffer circuit when PAD is substantially greater than VDDIO, it is known to place the PMOS device MPO in a floating n-well (see, e.g., U.S. Pat. No. 5,160,855, the disclosure of which is incorporated by reference herein). The well of a given device is typically defined by a voltage potential at a bulk of the device. Typically, a special voltage generator circuit 200 is used, an example of which is depicted in FIG. 2, which generates a voltage, VFLT, at an output node N2 of the circuit that is equal to the higher of either VDDIO or PAD. Node N2 of the voltage generator circuit 200 is connected to the bulk of PMOS device MPO (FIG. 1), so that the well of the MPO is always biased to the potential VFLT. However, when PAD is within a threshold voltage above or below VDDIO, the two PMOS devices, MPF1 and MPF2, generating the n-well bias voltage VFLT will be turned off, and thus the n-well in which PMOS device MPO is formed will truly be floating. Circuits having floating wells are generally highly susceptible to latch-up, particularly during latch-up testing and even during normal operation of the circuit.

Accordingly, there exists a need for an improved floating well circuit that does not suffer from one or more of the problems exhibited by conventional floating well circuits.

SUMMARY OF THE INVENTION

The present invention meets the above-noted need by providing, in an illustrative embodiment, a circuit for defining a voltage potential of a floating well in which is formed at least one metal-oxide-semiconductor (MOS) device. The circuit is advantageously configured such that the voltage potential of the well is always defined over a voltage range of operation of the circuit. Since the voltage potential of well remains defined over the entire specified voltage range, the device formed in the well will beneficially exhibit enhanced latch-up performance.

In accordance with one aspect of the invention, a circuit for defining a voltage potential of a floating well in which is formed at least one metal-oxide-semiconductor device includes a sense circuit operative to detect a voltage at a node to which the floating well is connected and to generate a control signal indicative of whether the voltage at the node is substantially within a voltage range. A lower value of the voltage range is substantially equal to a threshold voltage below a first supply voltage of the circuit. An upper value of the voltage range is substantially equal to a threshold voltage above the first supply voltage. The circuit for defining the voltage potential of the floating well further includes a voltage generator circuit operative to receive the control signal and to generate a bias signal for setting a voltage potential of the well in response to the control signal, the bias signal being controlled throughout the voltage range.

In accordance with another aspect of the invention, an integrated circuit includes one or more circuits for defining a voltage potential of a floating well in which is formed at least one metal-oxide-semiconductor device. A given one of the circuits for defining the voltage potential of the floating well includes a sense circuit operative to detect a voltage at a node to which the floating well is connected and to generate a control signal indicative of whether the voltage at the node is substantially within a voltage range. A lower value of the voltage range is substantially equal to a threshold voltage below a first supply voltage of the circuit. An upper value of the voltage range is substantially equal to a threshold voltage above the first supply voltage. The circuit for defining the voltage potential of the floating well further includes a voltage generator circuit operative to receive the control signal and to generate a bias signal for setting a voltage potential of the well in response to the control signal, the bias signal being controlled throughout the voltage range.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative output driver stages for use, for example, in a buffer circuit (e.g., output buffer, input buffer, bidirectional buffer). It should be understood, however, that the present invention is not limited to these or any other particular circuit arrangements. Rather, the invention is more generally applicable to techniques for improving a latch-up performance in a circuit comprising at least one device formed in a floating well. Although implementations of the present invention are described herein with specific reference to PMOS and NMOS transistor devices, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Figure 1:
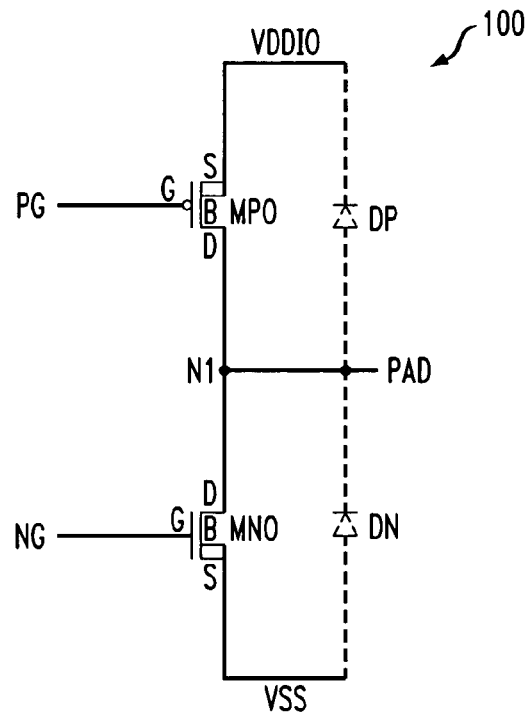
FIG. 1 is a schematic diagram illustrating an output stage of a conventional buffer circuit.

FIG. 1 is a schematic diagram illustrating an output stage 100 of a conventional bidirectional CMOS buffer circuit. The output stage 100 includes a PMOS device, MPO, and an NMOS device, MNO. The PMOS device MPO has a source (S) connected to a supply voltage, VDDIO, a drain (D) connected to an external IO pad at node N1, a gate (G) driven by a first control signal, PG, and a bulk (B) which, in this circuit, is connected to VDDIO. The NMOS device MNO has a source and a bulk connected to VSS, a drain connected to node N1, and a gate driven by a second control signal, NG.

In this circuit configuration, there are two parasitic diodes, a first diode, DP, associated with device MPO and being connected between node N1 and VDDIO, and a second diode, DN, associated with device MNO and being connected between node N1 and VSS. In a receiving mode of the buffer circuit, both devices MPO and MNO are turned off, and node N1 is driven by an external signal supplied via the IO pad. Assuming the buffer circuit is tolerant of voltages that are substantially higher than the supply voltage, diode DP will become forward biased, and thereby provide a direct path between node N1 and the voltage supply VDDIO, when a voltage, PAD, at node N1 is substantially greater than the supply voltage VDDIO. A typical application in which this scenario is likely to occur would be a 5-volt tolerant buffer running off a 3-volt power supply. One way to avoid this problem is to modify the output stage 100 by placing PMOS device MPO in a floating n-well, also referred to as an n-tub, having a voltage potential controlled by the illustrative voltage generator circuit 200 shown in FIG. 2.

Figure 2:
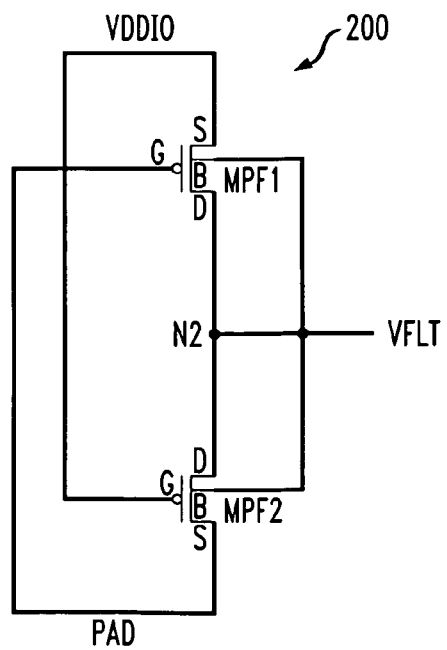
FIG. 2 is a schematic diagram illustrating a conventional voltage generator circuit for biasing a well in which a PMOS device is formed.

As shown in FIG. 2, voltage generator circuit 200 includes two PMOS devices, MPF1 and MPF2, connected in series between voltages VDDIO and PAD, with a bias voltage, VFLT, being generated at a common node N2. Device MPF1 is gated by PAD and device MPF2 is gated by VDDIO. Specifically, a source of MPF1 is connected to VDDIO, a gate of MPF1 is connected to PAD, a source of MPF2 is connected to PAD and a gate of MPF2 is connected to VDDIO. A drain and bulk of MPF1 is connected to a drain and bulk of MPF2 at node N2 to generate the bias voltage VFLT for biasing the n-well of PMOS device MPO shown in FIG. 1. This bias voltage is supplied to the bulk of MPO.

When PAD is substantially lower than VDDIO (e.g., PAD is about 1 volt and VDDIO is about 3.3 volts), MPF1 will be turned on and MPF2 will be turned off, thus setting VFLT substantially equal to VDDIO. When PAD is substantially higher than VDDIO (e.g., PAD is about 5 volts and VDDIO is about 3.3 volts), device MPF2 turns on and MPF1 turns off, thereby setting VFLT substantially equal to PAD. In either of these cases, the voltage VFLT will be the higher of either VDDIO or PAD. A disadvantage of this approach, however, is that when PAD is within one threshold voltage above and below VDDIO, the two PMOS devices, MPF1 and MPF2, generating the n-well bias voltage VFLT will be turned off, and thus VFLT will be undefined. This is given by the condition $$VDDIO-Vtp \leq PAD \leq VDDIO+Vtp, \qquad (1)$$

where Vtp is the threshold voltage of a PMOS device. The term "undefined" is intended to characterize the voltage potential VFLT as being undetermined and not precisely limited or controlled to any particular value at a given point in time. Instead, the value of VFLT may fluctuate, even in a random manner, when PAD falls within the voltage range specified by equation (1).

When PAD is within the voltage range specified by equation (1) above, the n-well which is biased by VFLT may be truly floating. As previously stated, circuits having floating wells are generally highly susceptible to latch-up, particularly during latch-up testing and even during normal operation of the circuit. One reason for this is that it is very easy to forward bias an emitter-to-base junction of a parasitic PNP device which is inherently present in the PMOS device structure. It is therefore desirable to bias the n-well to a well-defined, although not necessarily constant, voltage potential throughout the entire operating range of IO pad voltages (e.g., typically about 0 to 5.5 volts in a 5-volt application).

Figure 3:
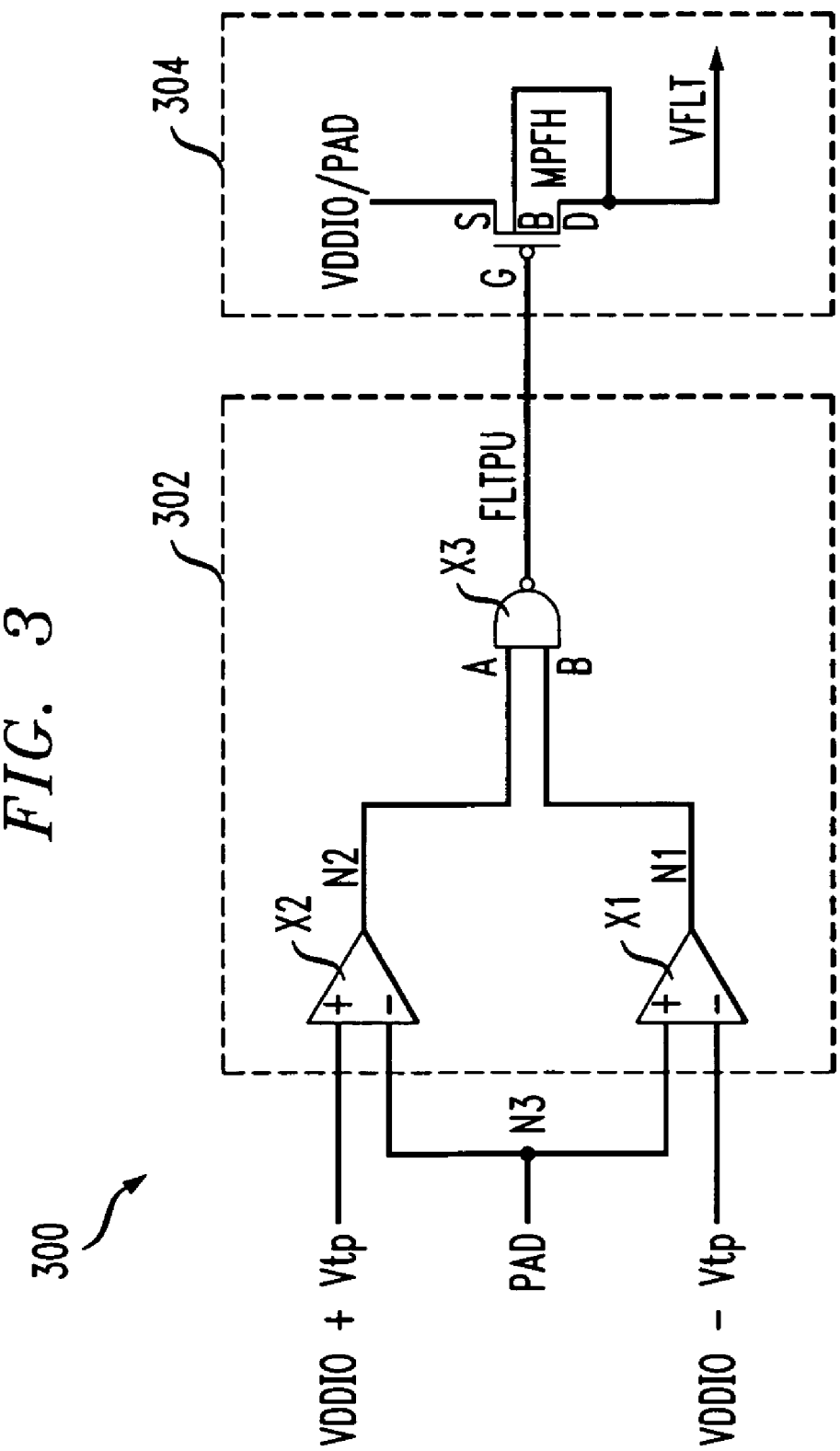
FIG. 3 is a schematic diagram depicting at least a portion of an exemplary floating well circuit operative to define a voltage potential of a well in which is formed an MOS device, in accordance with one embodiment of the present invention.

FIG. 3 is a schematic diagram depicting at least a portion of an exemplary circuit 300 operative to define a voltage potential of a floating well in which is formed at least one MOS device, in accordance with one embodiment of the present invention. The exemplary circuit 300 comprises a sense circuit 302 for detecting when a voltage, PAD, at an IO pad to which the floating well is connected falls within the range specified by equation (1) above, and a voltage generator circuit 304 for generating a bias voltage VFLT used to define the well. Sense circuit 302 is shown in terms of its functional equivalent for ease of explanation, although it is to be understood that the actual circuit implementation can be realized using various circuit configurations, in accordance with embodiments of the invention. Moreover, while the sense circuit 302 is described herein as being connected to an IO pad, in alternative circuit configurations, the pad may be used as an input, an output, or both, and therefore may be referred to herein generally as a signal pad, as being more closely indicative of a function thereof.

Exemplary sense circuit 302 comprises first and second comparators, X1 and X2, respectively, and a NAND gate, X3, or an alternative logical AND gate. A first input, which may be an inverting (−) input, of the first comparator X1 is preferably adapted to receive a first reference voltage which is substantially equal to a PMOS threshold voltage Vtp below supply voltage VDDIO (e.g., VDDIO−Vtp). A second input, which may be a non-inverting (+) input, of first comparator X1 and a first input, which may be an inverting input, of second comparator X2 are preferably connected together at node N3 and are adapted to receive the voltage PAD at the IO pad. A second input, which may be a non-inverting input, of second comparator X2 is preferably adapted to receive a second reference voltage which is substantially equal to a PMOS threshold voltage Vtp above VDDIO (e.g., VDDIO+Vtp). Output signals of the first and second comparators X1 and X2 at nodes N1 and N2, respectively, are preferably connected to first and second inputs (e.g., A and B) of NAND gate X3. NAND gate X3 generates a control signal, FLTPU, which is a logical AND function of the output signals at nodes N1 and N2. As will be apparent to those skilled in the art, the logical AND function may be implemented using NAND gate X3, as shown. Alternatively, the logical AND function can be implemented using, for example, a NOR gate, an AND gate, a wired AND connection, etc., with one or more logic inverters (not shown). Moreover, it is to be understood that sense circuit 302 is merely illustrative, and that the present invention is not limited to the particular sense circuit arrangement shown.

Control signal FLTPU preferably drives a PMOS device, MPFH, which may be included in the voltage generator circuit 304. Voltage generator circuit 304 preferably works in conjunction with circuit 200 shown in FIG. 2 to generate the voltage VFLT for biasing a floating well in which at least a portion of an output stage (e.g., of a buffer circuit) may be formed, as will be described in further detail below in connection with FIG. 4B. Voltage generator circuit 304 essentially supplements circuit 200 when the voltage PAD is within the range specified by equation (1) above. Circuit 300, in conjunction with voltage generator circuit 200 of FIG. 2, can be employed to advantageously bias the floating well to a defined voltage potential over an entire range of operation of the circuit. Device MPFH is preferably formed in a floating well and is configured having a source connecting to either VDDIO or VPAD (e.g., VDDIO/PAD), a drain and bulk connected together and generating the voltage VFLT, and a gate adapted for receiving control signal FLTPU. Those skilled in the art will recognize that because an MOS device is symmetrical in nature, and thus bidirectional, the assignment of source and drain designations in the MOS device is essentially arbitrary. Therefore, the source and drain of a given device may be referred to herein generally as first and second source/drains, respectively, where the term "source/drain" in this context denotes a source or a drain.

When the voltage PAD is at or near zero volts, node N1 in sense circuit 302 is at a logic low level (e.g., logic "0") and node N2 is at a logic high level (e.g., logic "1"), thereby setting the output of NAND gate X3, namely, control signal FLTPU, to a logic high level. As PAD increases and exceeds a first (e.g., lower) threshold level which is substantially equal to the first reference voltage VDDIO−Vtp, the output of comparator X1 at node N1 will go high and the output of comparator X2 at node N2 will remain high. Nodes N1 and N2 being a logic high level sets control signal FLTPU to a logic low level. Control signal FLTPU will remain low until PAD exceeds a second (upper) threshold level which is substantially equal to the second reference voltage, namely, VDDIO+Vtp. When PAD exceeds this upper threshold level, the output of the second comparator X2 at node N2 will go low, thereby setting control signal FLTPU to a logic high level. Thus, in sense circuit 302, control signal FLTPU is active low whenever the voltage PAD falls within the range specified by equation (1) above, although it is similarly contemplated that the control signal FLTPU may be active high when PAD falls within this specified voltage range, such as, for example, a logical inversion of signal FLTPU. Since control signal FLTPU drive PMOS device MPFH, during the time FLTPU is active, as defined by equation (1), the bias voltage VFLT can be set to a suitable potential rather than floating.

Figure 4B:
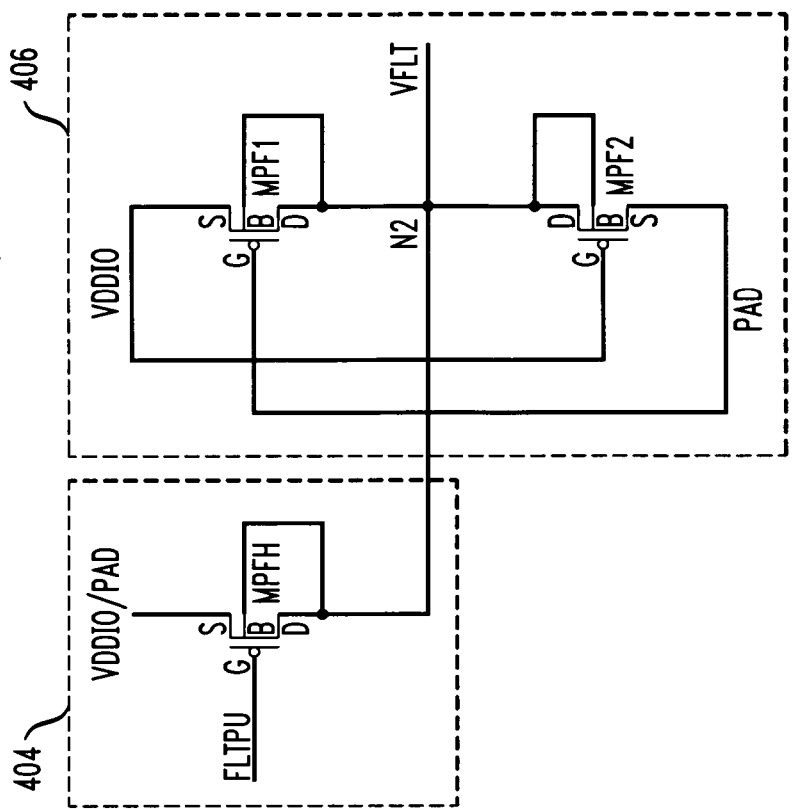
FIG. 4B is a schematic diagram depicting an exemplary voltage generator circuit suitable for use in the floating well circuit of FIG. 3, in accordance with an embodiment of the invention.
Figure 4A:
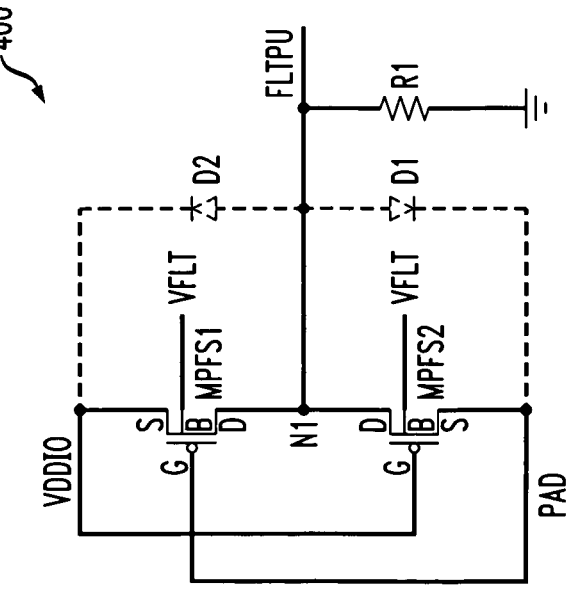
FIG. 4A is a schematic diagram depicting an exemplary sense circuit suitable for use in the floating well circuit of FIG. 3, in accordance with an embodiment of the invention.

FIGS. 4A and 4B are schematic diagrams illustrating at least portions of an exemplary sense circuit 400 and voltage generator circuit 402, respectively, which may be included in a floating well circuit, in accordance with an embodiment of the invention. Sense circuit 400 may be employed to implement sense circuit 302 depicted in FIG. 3. Likewise, voltage generator circuit 402 may be employed to implement voltage generator circuit 304 depicted in FIG. 3. As shown in FIG. 4A, sense circuit 400 comprises a first PMOS device, MPFS1, and a second PMOS device, MPFS2, connected in series between voltages VDDIO and PAD, with a control signal, FLTPU, being generated at a common node N1. Device MPFS1 is gated by PAD and device MPFS2 is gated by VDDIO. Specifically, a source of MPFS1 is adapted for connection to VDDIO, a gate of MPF1 is adapted for connection to PAD, a source of MPF2 is adapted for connection to PAD and a gate of MPF2 is adapted for connection to VDDIO. Drains of MPFS1 and MPFS2 are connected together at node N1 and generate the control signal FLTPU. Bulks of MPFS1 and MPFS2 are preferably biased by voltage VFLT generated, for example, by voltage generator circuit 402 shown in FIG. 4B, or a suitable alternative voltage source.

Sense circuit 400 is preferably operative in a manner similar to sense circuit 302 described above in conjunction with FIG. 3. Specifically, when PAD is substantially lower than VDDIO (e.g., PAD is greater than a PMOS threshold voltage below VDDIO), device MPFS1 is turned on and device MPFS2 is turned off, thereby pulling node N1, and thus control signal FLTPU, to VDDIO potential. Alternatively, when PAD is substantially higher than VDDIO (e.g., PAD is greater than a PMOS threshold voltage above VDDIO), device MPFS1 is turned off and device MPFS2 is turned on, thereby pulling control signal FLTPU to PAD potential. When PAD is within the range specified in equation (1) above, both devices MPFS1 and MPFS2 will be turned off, and therefore control signal FLTPU would be undefined. In order to prevent control signal FLTPU from becoming undefined, sense circuit 302 further includes a resistor, R1, or an alternative pull-down device (e.g., NMOS device, PMOS device, etc.), having a certain resistance value associated therewith. In the embodiment shown, resistor R1 is connected between node N1 and ground, although other circuit configurations are similarly contemplated. For example, resistor R1 may be connected to a voltage source other than ground (e.g., VDDIO). Thus, when PAD is within a PMOS threshold voltage of VDDIO, resistor R1 pulls control signal FLTPU to ground.

Devices MPFS1 and MPFS2 should be sized (e.g., by selecting an appropriate gate width-to-length (W/L) ratio of MPFS1 and MPFS2) relative to the resistance value of resistor R1 such that either of devices MPFS1 or MPFS2 prevails over resistor R1 when PAD is outside the voltage range specified in equation (1). In this manner, when PAD is outside this specified voltage range, control signal FLTPU will be substantially equal to the higher potential of either VDDIO or PAD. Additionally, the resistance value of R1 should be made as high as possible in order to reduce direct current (DC) consumption in the sense circuit 302, since there is a DC path to ground from either VDDIO or PAD when PAD is outside the voltage range specified in equation (1). Specifically, when PAD is low, device MPFS1 is turned on and a first DC path exists from VDDIO, through device MPFS1, through R1, to ground. When PAD is substantially higher than VDDIO, device MPFS2 is turned on and a second DC path exists from PAD, through device MPFS2, through R1, to ground.

As previously stated, the bulks of devices MPFS1 and MPFS2 are preferably connected to bias voltage VFLT generated by voltage generator circuit 402 depicted in FIG. 4B. If the bulks were connected to node N1, the respective wells of MPFS1 and MPFS2 would be pulled low when PAD is within the voltage range specified in equation (1). This would undesirably turn on parasitic diodes D1 and D2 between node N1 and PAD, and between node N1 and VDDIO, respectively.

With reference to FIG. 4B, exemplary voltage generator circuit 402 is operative to generate bias voltage VFLT, which may be used to define the potential of a well associated with a given MOS device, such as may be included in an output stage of a buffer circuit. Voltage generator circuit 402 includes a first circuit section 404 which is operative to define the bias voltage VFLT when PAD is within the voltage range specified in equation (1), and a second circuit section 406 which is operative to define bias voltage VFLT when PAD is outside the specified voltage range. The first circuit section 404 preferably comprises a PMOS device MPFH having a source connecting to VDDIO, a gate adapted for receiving control signal FLTPU generated by sense circuit 400 shown in FIG. 4A, and a drain and bulk connected together at node N2 for generating bias voltage VFLT. As apparent from the figure, second circuit section 406 may be formed in a manner similar to voltage generator circuit 200 shown in FIG. 2. Specifically, second circuit section 406 preferably comprises first and second PMOS devices MPF1 and MPF2, respectively, connected between VDDIO and PAD. A source of MPF1 connects to VDDIO, a gate of MPF1 connects to PAD, drains and bulks of MPF1 and MPF2 are connected together at node N2 for generating the bias signal VFLT, a source of MPF2 connects to PAD and a gate of MPF2 connects to VDDIO.

Operation of the voltage generator circuit 402 can be divided into at least two modes, namely, a first mode wherein the voltage PAD is outside of the voltage range specified in equation (1), and a second mode wherein PAD is within the voltage range specified in equation (1). During the first mode, control signal FLTPU will be substantially equal to the higher potential of VDDIO or PAD. Control signal FLTPU being high turns off device MPFH, thereby disabling first circuit section 404. The second circuit section 406 is operative in the first mode to set the bias voltage VFLT substantially equal to the higher potential of either VDDIO or PAD through device MPF1 or device MPF2, respectively. During the second mode, that is, when PAD is within one threshold voltage above or below VDDIO, devices MPF1 and MPF2 will be turned off, thereby effectively disabling second circuit section 406. Control signal FLTPU will be low during the second mode, thereby turning on device MPFH such that the first circuit section 404 is operative to define the bias voltage VFLT. In this manner, VFLT is always defined throughout an entire range of operation of the voltage generator circuit 402.

The source of device MPFH can be connected to either VDDIO or PAD. If the source of MPFH is connected to VDDIO, then VFLT will be pulled substantially to VDDIO when control signal FLTPU goes low (e.g., during the second mode). Alternatively, if the source of MPFH is connected to PAD, then VFLT will be pulled substantially to PAD when control signal FLTPU goes low. Because the resistance value of resistor R1 is preferably made substantially high (e.g., about one megohm) in order to reduce current consumption in the sense circuit 400, the control voltage FLTPU generated at node N1 of the sense circuit changes slowly (see FIG. 4A). A current path through device MPFH is provided either from VDDIO or from PAD, depending on where the source of MPFH is connected. Device MPFH is preferably sized to be substantially weak in order to minimize the DC current in the voltage generator circuit. A weak device may be defined as a device having a substantially long channel length, such as, for example, about 5 micrometers (μm) or larger in a 0.5-μm process.

Figure 5:
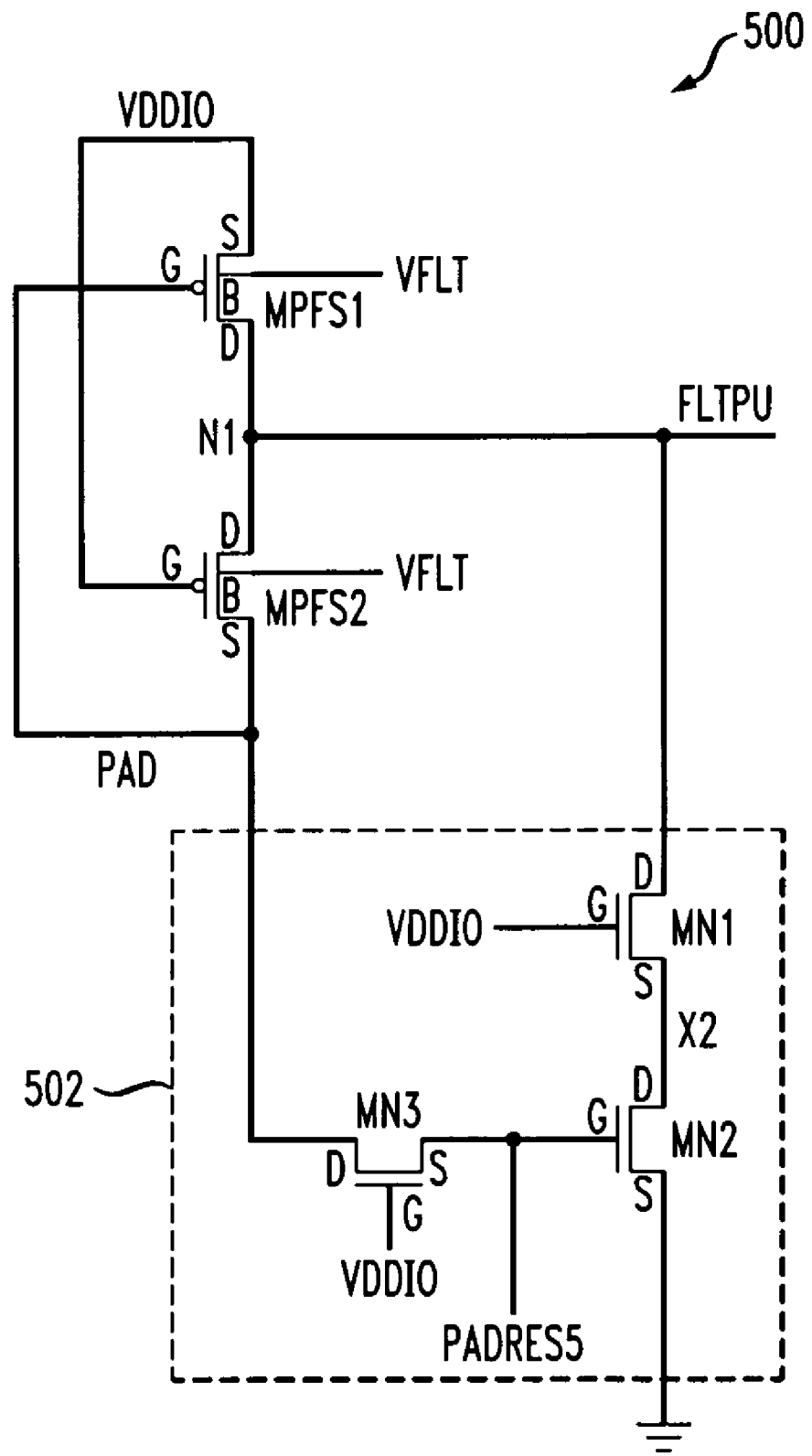
FIG. 5 is a schematic diagram depicting an exemplary sense circuit suitable for use in the floating well circuit of FIG. 3, in accordance with another embodiment of the invention.

FIG. 5 is a schematic diagram depicting an exemplary sense circuit 500, formed in accordance with another embodiment of the invention. The sense circuit 500 is essentially the same as sense circuit 400 shown in FIG. 4A, except that resistor R1 has been replaced by a pull-down circuit 502 comprising one or more NMOS devices connected in series between node N1 and ground, or an alternative voltage source. In exemplary sense circuit 500, two NMOS devices, MN1 and MN2, are employed, although the invention is not limited to the number of devices shown. A drain of device MN1 is preferably connected to node N1, a gate of MN1 connects to VDDIO, a source of MN1 is connected to a drain of device MN2 at node X2, and a source of MN2 connects to ground. A gate of device MN2 is preferably adapted for receiving a second control signal, PADRES5. Control signal PADRES5 may be generated, for example, by passing the voltage PAD through an NMOS device, MN3, which is gated by VDDIO. A drain of device MN3 preferably connects to PAD, a source of MN3 is connected to the gate of device MN2, and a gate of MN3 is adapted for receiving VDDIO. In this manner, PADRES5 will normally be at a voltage potential which is about one threshold below VDDIO.

Device MN1 functions primarily to protect device MN2 from an over voltage condition, since the control signal FLTPU can be at a substantially higher potential than what is supported by the process technology used to fabricate the sense circuit. This is particularly important, for example, when sense circuit 500 is employed in a 5-volt tolerant buffer running at 3.3 volts, wherein control signal FLTPU may be as high as 5 volts. If the voltage FLTPU is guaranteed not to exceed VDDIO by any appreciable amount (e.g., less than about 0.3 volt), device MN1 can be omitted and device MN2 can be connected directly to node N1.

When PAD is substantially lower than VDDIO, device MPFS1 is turned on but device MN2 is turned off, and therefore there will be no DC path from VDDIO to ground. However, when PAD is substantially higher than VDDIO (e.g., PAD=5 volts and VDDIO=3.3 volts), devices MPFS2 and MN2 will be turned on and a DC path will be established from PAD, through devices MPFS2, MN1 and MN2, to ground. In order to minimize the DC current through this path, either one or both of devices MN1 and MN2 should be sized to be somewhat weak.

Figure 6A:
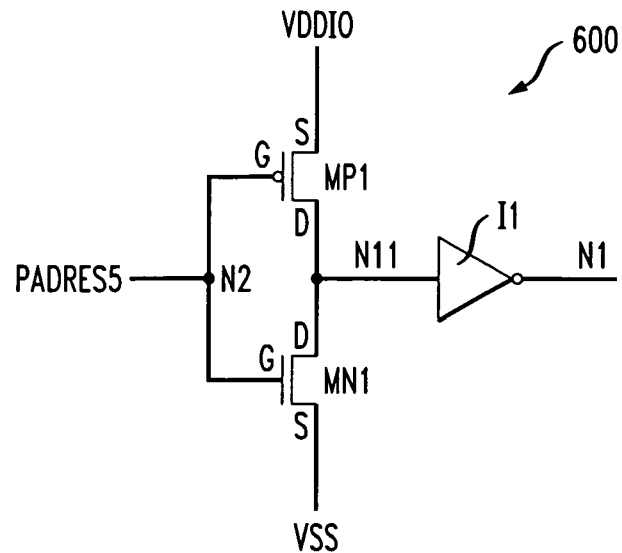
FIG. 6A is a schematic diagram depicting an exemplary comparator circuit suitable for implementing a first comparator in the sense circuit of FIG. 3, in accordance with an embodiment of the invention.
Figure 6B:
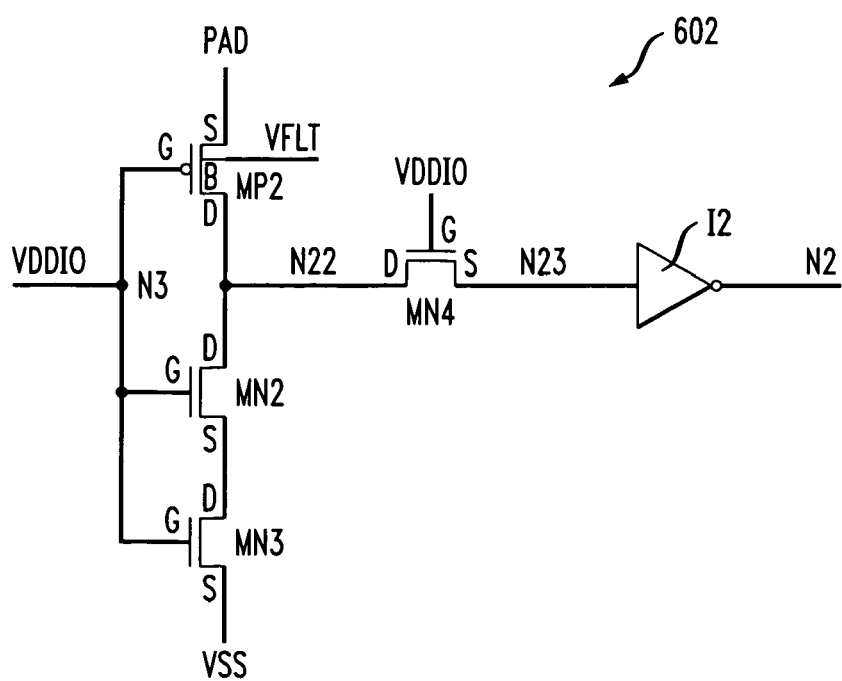
FIG. 6B is a schematic diagram depicting an exemplary comparator circuit suitable for implementing a second comparator in the sense circuit of FIG. 3, in accordance with an embodiment of the invention.

As previously explained, device MPFH is preferably sized to be substantially weak in order to minimize the DC current in the voltage generator circuit 402 shown in FIG. 4B. Since MPFH is a weak device, the well is pulled to either VDDIO or PAD through a high impedance bias voltage VFLT when PAD is within the voltage range specified in equation (1). Although this is better than allowing the well to float when PAD is within a threshold voltage of VDDIO, it is desirable that bias voltage VFLT be taken to a know potential through a lower impedance. FIGS. 6A and 6B depict another implementation of the exemplary sense circuit 302 shown in FIG. 3 for generating a control signal FLTPU having lower impedance compared to the illustrative sense circuits 400 and 500 shown in FIGS. 4A and 5, respectively.

FIG. 6A is a schematic diagram depicting an exemplary comparator circuit 600 which can be used for implementing the first comparator X1 shown in FIG. 3, in accordance with an embodiment of the present invention. Comparator circuit 600 preferably comprises a first inverter including a PMOS device, MP1, and an NMOS device, MN1, connected in a conventional manner. Specifically, a source of device MP1 preferably connects to VDDIO, a source of device MN1 connects to VSS, drains of MP1 and MN1 are connected together to form an output at node N11, and gates of MP1 and MN1 are connected together to form an input at node N2. The input of the first inverter is adapted for receiving a signal PADRES5, which may be generated by an NMOS device connected to PAD and gated by VDDIO, as in the sense circuit 500 previously described in conjunction with FIG. 5. The comparator circuit 600 further comprises a second inverter, I1, having an input connected to the output of the first inverter at node N11 and generating an output of comparator circuit 600 at node N1.

The first inverter is preferably configured having a switching point that is significantly higher compared to a standard inverter. This can be accomplished, for example, by scaling devices MP1 and MN1 such that a W/L ratio, and therefore a gain, of MP1 is substantially greater than a W/L ratio of MN1. When signal PADRES5 is at zero potential, device MP1 will be turned on and device MN1 will be turned off, thereby causing node N11 to be pulled high and the output of the comparator circuit 600 at node N1 to be low. As the potential of signal PADRES5 increases from zero, node N11 will remain high and the output of comparator circuit 600 at node N1 will remain low. As PADRES5 continues to rise, device MN1 will turn on, but to a lesser extent than device MP1, since MP1 has a substantially greater gain compared to MN1. Thus, node N11 will remain high and node N1 will remain low. When PADRES5 rises to within one threshold voltage below VDDIO, device MP1 will turn off and node N11 will be pulled low by device MN1, thereby causing node N1 to go high.

FIG. 6B is a schematic diagram depicting an exemplary comparator circuit 602 which can be used for implementing the second comparator X2 shown in FIG. 3, in accordance with an embodiment of the present invention. Comparator circuit 602 preferably comprises a first inverter stage including two stacked NMOS devices, MN2 and MN3, and a PMOS device, MP2. A source of device MP1 preferably connects to the voltage PAD, a bulk of MP1 connects to bias voltage VFLT, a drain of MP1 is connected to a drain of device MN2 at node N22 and forms an output of the first inverter stage, a source of MN2 is connected to a drain of device MN1, and a source of MN1 connects to VSS. Gates of devices MP1, MN2 and MN3 are connected together at node N3 to form an input of the first inverter stage, which is preferably connected to VDDIO. Comparator circuit 602 further comprises a second inverter, I2, having an input connected to the output of the first inverter stage via an NMOS pass gate, MN4, or alternative switching circuitry (e.g., multiplexer). The pass gate MN4 is preferably connected between the output of the first inverter stage at node N22 and the input of the second inverter I2 at node N23, and is gated by VDDIO. An output of comparator circuit 602 is generated by second inverter I2 at node N2.

Like the first inverter in comparator circuit 600 shown in FIG. 6A, a switching point of the first inverter stage in comparator circuit 602 is preferably configured to be substantially high compared to a standard inverter. Again, this can be accomplished by making a W/L ratio of device MP1 substantially higher than W/L ratios of one or both of devices MN2 and MN3. When PAD is at zero potential, device MP1 will be turned off and node N22 will be pulled low through devices MN2 and MN3, which will be turned on. With node N22 low, node N23 will also be low, thereby causing the output of comparator circuit 602 at node N2 to be high. As PAD increases from zero, output node N22 will remain low and the output of comparator circuit 602 at node N2 will remain high.

When PAD exceeds VDDIO by one threshold voltage, device MP1 will turn on pulling node N22 high. With node N22 high, node N23 will go high as well, thereby causing the output of comparator circuit 602 at node N2 to go low. Since node N22 can see a much higher voltage than VDDIO, device MN4 functions primarily to protect inverter I2 from over voltage stress by clamping the voltage at node N23 to about a threshold voltage below VDDIO.

As previously described in connection with FIG. 3, the two outputs from the comparator circuits 600 and 602 depicted in FIGS. 6A and 6B, respectively, are fed to a NAND gate (e.g., NAND gate X3) to generate the control signal FLTPU which is used by voltage generator circuit for generating the bias voltage VFLT for defining the potential of the well. Both outputs from the comparator circuits 600, 602 will be high when the voltage PAD is within one threshold voltage below and above VDDIO. The control signal FLTPU generated at the output of the NAND gate (X3) is therefore low only when PAD satisfies equation (1). Control signal FLTPU is very well defined and can be used to drive a reasonably sized load, such as PMOS device MPFH, so that bias voltage VFLT can be pulled to either VDDIO or PAD with a substantially low impedance (e.g., about 1 kilo ohms or less).

Figure 7:
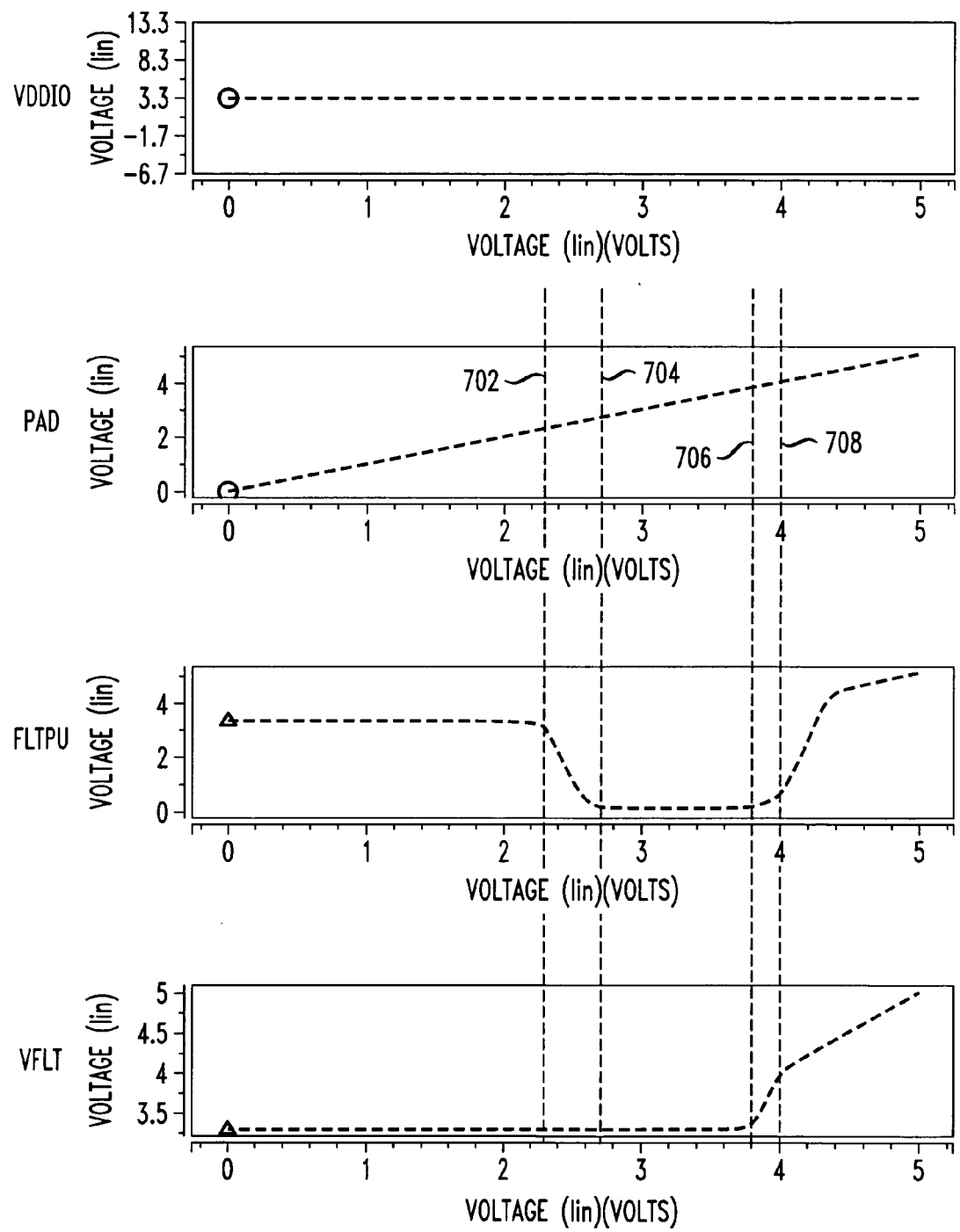
FIG. 7 is a graphical illustration depicting exemplary waveforms relating to the circuit implementations of FIGS. 4A and 4B, in accordance with the invention.

By way of example only, FIG. 7 depicts illustrative waveforms for the exemplary circuit implementations of FIGS. 4A and 4B. As shown in FIG. 7, the supply voltage (VDDIO) is set at 3.3 volts and the voltage at the IO pad (PAD) is swept linearly from 0 to 5 volts. The control voltage FLTPU is initially at a potential substantially equal to 3.3 volts and the bias voltage VFLT is initially about 3.3 volts. When PAD is increased to about 2.3 volts, control signal FLTPU starts to go low, as indicated by reference numeral 702. As PAD increases to within about one threshold voltage below VDDIO (e.g., about 2.7 volts), FLTPU is low (e.g., about zero volt), as indicated by reference numeral 704. Control signal FLTPU remains low as PAD continues to rise, until PAD is about one threshold voltage above VDDIO (e.g., about 3.8 volts). At this point control signal FLTPU starts to go high, as indicated by reference numeral 706. As PAD increases above about 4.3 volts, control signal FLTPU is substantially equal to PAD.

Bias voltage VFLT remains substantially constant at about 3.3 volts throughout the entire voltage range that PAD is less than about one threshold voltage above VDDIO (e.g., about 3.8 volts). Once PAD exceeds about one threshold voltage above VDDIO (e.g., about 4.0 volts), as indicated by reference numeral 708, bias voltage VFLT is substantially equal to PAD for the remainder of the operable voltage range of the circuit. As apparent from the figure, the bias voltage VFLT, which may be used to set the potential of the well of one or more MOS devices, remains at a well-defined voltage throughout the entire voltage range for PAD. An MOS device having a floating well which is biased using VFLT would thus be less susceptible to latch-up.

Figure 8:
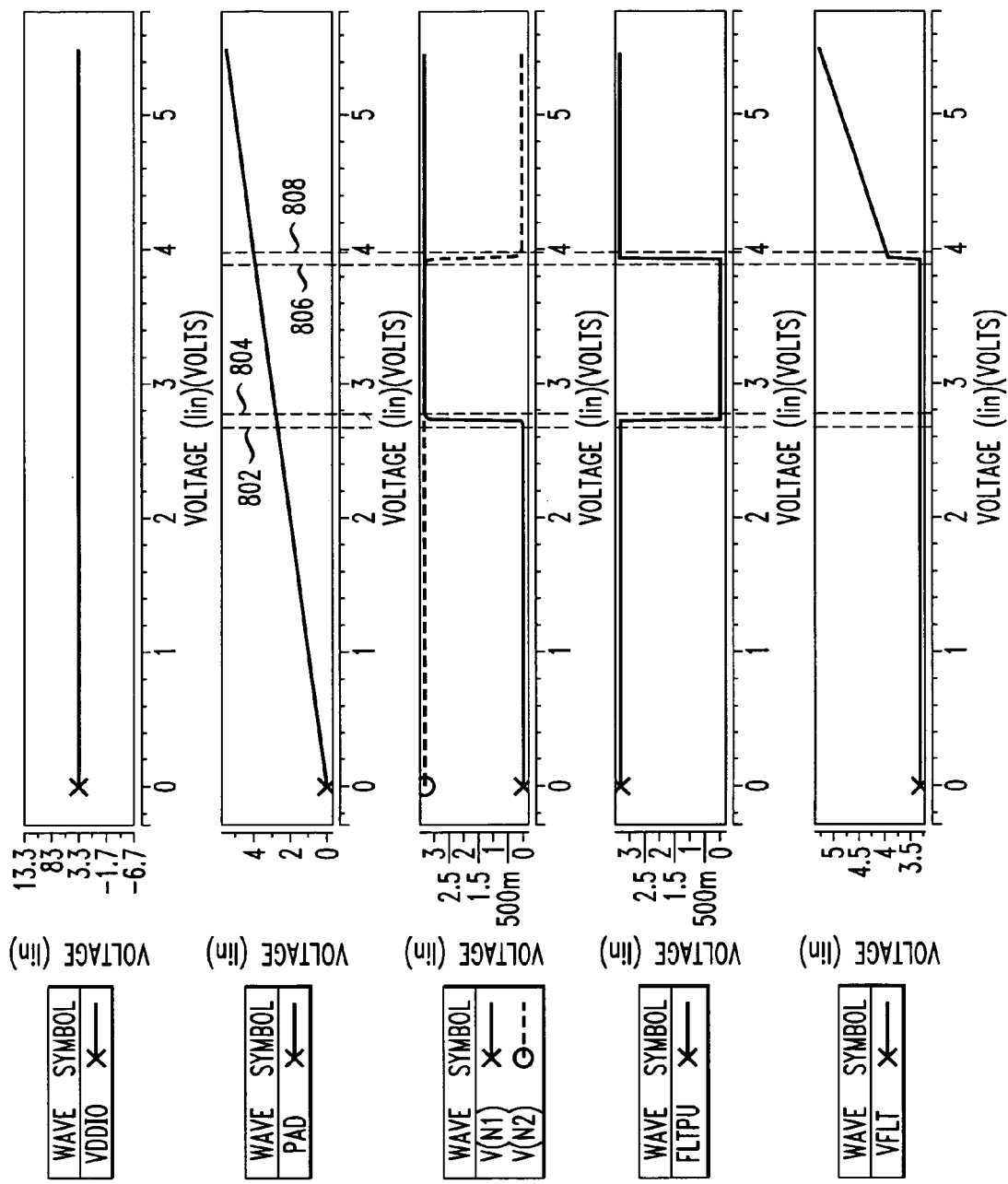
FIG. 8 a graphical illustration depicting exemplary waveforms relating to the circuit implementations of FIGS. 6A and 6B, in accordance with the invention.

By way of example only, FIG. 8 depicts illustrative waveforms for the exemplary circuit implementations of FIGS. 6A and 6B. As shown in FIG. 8, the supply voltage (VDDIO) is set at 3.3 volts and the voltage at the IO pad (PAD) is swept linearly from 0 to 5 volts. The output of the first comparator circuit 600 (see FIG. 6A) at node N1, V(N1), is initially low (e.g., zero volt) and the output of the second comparator circuit 602 (see FIG. 6B) at node N2, V(N2), is initially about 3.3 volts. Control signal FLTPU, which is a logical NAND of signals V(N1) and V(N2), will be initially about 3.3 volts and the bias voltage VFLT is initially about 3.3 volts. When PAD is increased to about 2.6 volts, as indicated by reference numeral 802, signal V(N1) starts to go high, thereby causing control signal FLTPU to go low. As PAD increases to within about one threshold voltage below VDDIO (e.g., about 2.7 volts), V(N1) is high (e.g., about 3.3 volts) and FLTPU is low (e.g., about zero volt), as indicated by reference numeral 804. V(N1) remains high as PAD continues to increase.

In comparison to the circuit implementation represented by the waveforms shown in FIG. 7, control signal FLTPU depicted in FIG. 8 transitions from high to low, and from low to high, over a substantially smaller voltage range of PAD. This is due to primarily to the fact that control signal FLTPU generated using the circuit implementations of FIGS. 6A and 6B is of lower impedance and higher gain compared to the control signal FLTPU generated using the circuit implementations of FIGS. 4A and 4B.

Control signal FLTPU remains low as PAD continues to rise, until PAD is about one threshold voltage above VDDIO (e.g., about 3.9 volts). At this point, indicated by reference numeral 806, signal V(N2) starts to go low (e.g., about zero volt), thereby causing control signal FLTPU to go high. When PAD exceeds about one threshold voltage above VDDIO (e.g., about 4.0 volts), as indicated by reference numeral 808, signal V(N2) is low and control signal FLTPU is about 3.3 volts. Bias voltage VFLT remains substantially constant at about 3.3 volts throughout the entire voltage range that PAD is less than about one threshold voltage above VDDIO. Once PAD exceeds about 4.0 volts, bias voltage VFLT is substantially equal to PAD for the remainder of the operable voltage range of the circuit. Like the circuit implementations of FIGS. 4A and 4B, using the circuit implementations of FIGS. 6A and 6B, the bias voltage VFLT remains at a well-defined voltage potential throughout the entire operable voltage range for PAD.

At least a portion of the floating well circuits of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A circuit for defining a voltage potential of a floating well in which is formed at least one metal-oxide-semiconductor device, the circuit comprising:

a sense circuit operative to detect a voltage at a node to which the floating well is connected and to generate a control signal indicative of whether the voltage at the node is substantially within a voltage range, a lower value of the voltage range being substantially equal to a threshold voltage below a first supply voltage of the circuit, an upper value of the voltage range being substantially equal to a threshold voltage above the first supply voltage; and a voltage generator circuit operative to receive the control signal and to generate a bias signal for setting a voltage potential of the well in response to the control signal, the bias signal being controlled throughout the voltage range;

wherein the sense circuit comprises;

first and second PMOS devices, a first source/drain of the first PMOS device being adapted for connection to the first supply voltage, a first source/drain of the second PMOS device being adapted for connection to the node to which the floating well is connected, a second source/drain of the first PMOS device being connected to a second source/drain of the second PMOS device and forming an output of the sense circuit for generating the control signal, a gate of the second PMOS device being adapted for connection to the first supply voltage, a gate of the first PMOS device being adapted for connection to the node to which the floating well is connected, and bulks of the first and second PMOS devices being adapted for receiving the bias signal; and a resistive element connected between the output of the sense circuit and a second voltage source.

2. The circuit of claim 1, wherein the first and second PMOS devices are sized relative to a resistance value of the resistive element such that the first and second PMOS devices are able to pull up the output of the sense circuit to substantially one of the first supply voltage and the voltage at the node to which the floating well is connected when the voltage at the node is within the voltage range.

3. The circuit of claim 1, wherein the resistive element comprises first, second and third NMOS devices, a first source/drain of the first NMOS device being connected to the output of the sense circuit, a second source/drain of the first NMOS device being connected to a first source/drain of the second NMOS device, a second source/drain of the second NMOS device being adapted for connection to the second voltage source, gates of the first and third NMOS device being adapted for connection to the first supply voltage, a gate of the second NMOS device being connected to a first source/drain of the third NMOS device, and a second source/drain of the third NMOS device being adapted for connection to the node to which the floating well is connected.

4. A circuit for defining a voltage potential of a floating well in which is formed at least one metal-oxide-semiconductor device, the circuit comprising:
 a sense circuit operative to detect a voltage at a node to which the floating well is connected and to generate a control signal indicative of whether the voltage at the node is substantially within a voltage range, a lower value of the voltage range being substantially equal to a threshold voltage below a first supply voltage of the circuit, an upper value of the voltage range being substantially equal to a threshold voltage above the first supply voltage; and
 a voltage generator circuit operative to receive the control signal and to generate a bias signal for setting a voltage potential of the well in response to the control signal, the bias signal being controlled throughout the voltage range;
 wherein the voltage generator circuit comprises at least a first circuit section for generating the bias signal independent of the control signal and a second circuit section for generating the bias signal as a function of the control signal, the voltage generator circuit being operative in one of at least a first mode indicative of the voltage at the node to which the floating well is connected being outside the voltage range, and a second mode indicative of the voltage at the node to which the floating well is connected being within the voltage range, the first circuit section being operative during the first mode to generate the bias signal, and the second circuit section being operative during the second mode to generate the bias signal.

5. The circuit of claim 4, wherein the first circuit section is disabled during the second mode.

6. The circuit of claim 4, wherein the second circuit section is disabled during the first mode.

7. The circuit of claim 4, wherein the voltage generator circuit is operative to selectively switch between the first and second circuit sections in response to the control signal.

8. A circuit for defining a voltage potential of a floating well in which is formed at least one metal-oxide-semiconductor device, the circuit comprising:
 a sense circuit operative to detect a voltage at a node to which the floating well is connected and to generate a control signal indicative of whether the voltage at the node is substantially within a voltage range, a lower value of the voltage range being substantially equal to a threshold voltage below a first supply voltage of the circuit, an upper value of the voltage range being substantially equal to a threshold voltage above the first supply voltage; and
 a voltage generator circuit operative to receive the control signal and to generate a bias signal for setting a voltaae potential of the well in response to the control signal, the bias signal being controlled throughout the voltage range;
 wherein the sense circuit comprises:
 a first comparator, the first comparator including a first input adapted for receiving a voltage substantially equal to the lower value of the voltage range, and a second input adapted for receiving the voltage at the node to which the floating well is connected, the first comparator generating a first output signal which is a function of a voltage difference between the first and second inputs of the first comparator; and
 a second comparator, the second comparator including a first input adapted for receiving a voltage substantially equal to the upper value of the voltage range, and a second input adapted for receiving the voltage at the node to which the floating well is connected, the second comparator generating a second output signal which is a function of a voltage difference between the first and second inputs of the second comparator;
 wherein the control signal is a logical AND function of the first and second output signals.

9. The circuit of claim 8, wherein the first input of the first comparator comprises an inverting input, the second input of the first comparator comprises a non-inverting input, the first input of the second comparator comprises a non-inverting input and the second input of the second comparator comprises an inverting input.

10. The circuit of claim 8, wherein the first comparator comprises a PMOS device, an NMOS device and an inverter, a first source/drain of the PMOS device being adapted for connection to the first supply voltage, a second source/drain of the PMOS device being connected to an input of the inverter and to a first source/drain of the NMOS device, a second source/drain of the NMOS device being adapted for connection to a second voltage source supplying a second voltage, gates of the PMOS and NMOS devices being adapted for receiving the voltage at the node to which the floating well is connected, and an output of the inverter generating the first output signal.

11. The circuit of claim 10, wherein at least one of the PMOS device and the NMOS device is sized such that a gain of the PMOS device is substantially higher relative to a gain of the NMOS device.

12. The circuit of claim 8, wherein the second comparator comprises a PMOS device, first second and third NMOS devices, and an inverter, a first source/drain of the PMOS device being adapted for connection to the node to which the floating well is connected, a bulk of the PMOS device is adapted for receiving the bias signal, a second source/drain of the PMOS device being connected to a first source/drain of the first NMOS device and a first source/drain of the second NMOS device, a second source/drain of the first NMOS device being connected to a first source/drain of the third NMOS device, a second source/drain of the third NMOS device being adapted for connection to a second voltage source, gates of the PMOS device and first and third NMOS devices being connected together and adapted for receiving the first supply voltage, a second source/drain of the second NMOS device being connected to an input of the inverter, and an output of the inverter generating the second output signal.

13. A circuit for defining a voltage potential of a floating well in which is formed at least one metal-oxide-semiconductor device, the circuit comprising:
 a sense circuit operative to detect a voltage at a node to which the floating well is connected and to generate a control signal indicative of whether the voltage at the node is substantially within a voltage range, a lower value of the voltage range being substantially equal to a threshold voltage below a first supply voltage of the circuit, an upper value of the voltage range being substantially equal to a threshold voltage above the first supply voltage; and
 a voltage generator circuit operative to receive the control signal and to generate a bias signal for setting a voltage potential of the well in response to the control signal, the bias signal being controlled throughout the voltage range.

14. The circuit of claim 13, wherein the voltage generator circuit comprises a PMOS device, a first source/drain of the PMOS device being adapted for connection to the first supply voltage, a bulk and a second source/drain of the PMOS device being adapted for connection to the node to which the floating well is connected, and a gate of the PMOS device being adapted for receiving the control signal.

15. The circuit of claim 13, wherein the voltage generator circuit comprises first, second and third PMOS devices, a first source/drain of the first PMOS device being adapted for connection to the first supply voltage, a first source/drain of the second PMOS device being adapted for connection to the node to which the floating well is connected, a gate of the first PMOS device being adapted for connection to the node to which the floating well is connected, a gate of the second PMOS device being adapted for connection to the first supply voltage, a bulk and a second source/drain of the first PMOS device being connected to a bulk and a second source/drain of the second PMOS device for forming an output of the voltage generator circuit for generating the bias signal, a first source/drain of the third PMOS device being adapted for connection to one of the first supply voltage and the node to which the floating well is connected, a bulk and a second source/drain of the third PMOS device being connected to the output of the voltage generator circuit, and a gate of the third PMOS device being adapted for receiving the control signal.

16. The circuit of claim 13, wherein the node to which the floating well is connected comprises an external pad.

17. The circuit of claim 13, wherein the voltage generator circuit is operative to control the bias signal such that a voltage potential of the bias signal is substantially equal to at least one of the first supply voltage and the voltage at the node to which the floating well is connected.

18. The circuit of claim 13, wherein the sense circuit comprises:
a first comparator, the first comparator including a first input adapted for receiving a voltage substantially equal to the lower value of the voltage range, and a second input adapted for receiving the voltage at the node to which the floating well is connected, the first comparator generating a first output signal which is a function of a voltage difference between the first and second inputs of the first comparator;
a second comparator, the second comparator including a first input adapted for receiving a voltage substantially equal to the upper value of the voltage range, and a second input adapted for receiving the voltage at the node to which the floating well is connected, the second comparator generating a second output signal which is a function of a voltage difference between the first and second inputs of the second comparator; and
a NAND gate, the NAND gate including a first input adapted for receiving the first output signal, a second input adapted for receiving the second output signal, and an output for generating the control signal.

19. An integrated circuit including at least one circuit for defining a voltage potential of a floating well in which is formed at least one metal-oxide-semiconductor device, the at least one circuit comprising:
a sense circuit operative to detect a voltage at a node to which the floating well is connected and to generate a control signal indicative of whether the voltage at the node is substantially within a voltage range, a lower value of the voltage range being substantially equal to a threshold voltage below a first supply voltage of the circuit, an upper value of the voltage range being substantially equal to a threshold voltage above the first supply voltage; and
a voltage generator circuit operative to receive the control signal and to generate a bias signal for setting a voltage potential of the well in response to the control signal, the bias signal being controlled throughout the voltage range.

20. The integrated circuit of claim 19, wherein the voltage generator circuit is operative to control the bias signal such that a voltage potential of the bias signal is substantially equal to at least one of the first supply voltage and the voltage at the node to which the floating well is connected.

* * * * *